(12) United States Patent
Hoshi

(10) Patent No.: US 6,768,153 B2
(45) Date of Patent: Jul. 27, 2004

(54) SEMICONDUCTOR DEVICE

(75) Inventor: Hiroyuki Hoshi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/326,129

(22) Filed: Dec. 23, 2002

(65) Prior Publication Data

US 2004/0012044 A1 Jan. 22, 2004

(30) Foreign Application Priority Data

Jul. 22, 2002 (JP) ........................................ 2002-212864

(51) Int. Cl.[7] ....................... H01L 27/108; H01L 29/76; H01L 29/94; H01L 31/119
(52) U.S. Cl. ....................... 257/300; 257/296; 257/307; 257/533
(58) Field of Search ................................ 257/296, 299, 257/300, 307, 533, 535

(56) References Cited

U.S. PATENT DOCUMENTS

| | | | |
|---|---|---|---|
| 5,801,412 A | | 9/1998 | Tobita |
| 6,495,874 B1 | * | 12/2002 | Kawamura et al. .......... 257/301 |
| 2002/0063298 A1 | * | 5/2002 | Wang .......................... 257/379 |
| 2003/0042521 A1 | * | 3/2003 | Yoshitomi et al. .......... 257/296 |

* cited by examiner

*Primary Examiner*—Ngân V. Ngô
(74) *Attorney, Agent, or Firm*—Leydig, Voit & Mayer, Ltd.

(57) ABSTRACT

A semiconductor device includes a metal-insulator-metal (MIM) capacitor having a lower metal layer disposed on a substrate, a dielectric film, and upper metal layers, a testing electrode pad connected to the lower metal layer of the MIN capacitor, two connecting terminals located on the substrate connected to the upper metal layers, and a field effect transistor (FET) having an electrode connected to one of the upper metal layers. By grounding the connecting terminals located on the substrate, and impressing a test voltage on the testing electrode pad, a withstand voltage test of the MIM capacitor can be conducted without damaging the FET.

10 Claims, 11 Drawing Sheets

SEMICONDUCTOR DEVICE

BACKGROUND OF THE INVENTION

1. Field of the Invention

The present invention relates to a semiconductor device, and more specifically to a semiconductor device comprising metal-insulator-metal (MIM) capacitor.

2. Description of the Related Art

In semiconductor devices used in communication equipment or cellular phones using microwaves, transistors that use compound semiconductors as elements for low noise amplifiers suited to radio-frequency operation are used for down-sizing and performance improvement of semiconductor devices.

In such semiconductor devices, for example, multistage amplifiers, transistors are used as elements for amplifiers, and DC power is supplied thereto. In order that the source of such DC power does not adversely affect the RF properties of elements for amplifiers, capacitors are connected to DC power terminals; and in order to isolate DC power between amplifier stages, capacitors are connected between stages.

FIG. 30 is a circuit diagram of a conventional amplifier.

In FIG. 30, reference numeral 200 denotes the amplifier shown here by the circuit diagram. Reference numerals 202 and 204 denote field effect transistors (hereafter abbreviated as FETs), and reference numerals 206 and 208 denote grounding ends. The source terminals of the FETs 202 and 204 are grounded by the grounding ends 206 and 208, respectively.

Reference numerals 210, 212, 214, and 216 denote DC electrodes.

DC power is supplied to the gate terminal of the FET 202 from the DC electrode 210; to the drain terminal of the FET 202 from the DC electrode 212; to the gate terminal of the FET 204 from the DC electrode 214; and to the drain terminal of the FET 202 from the DC electrode 216. Reference numerals 218, 220, 222, 224, and 226 denote capacitors used in this amplifier.

Reference numerals 228, 230, 232, and 234 denote the paths of electric current flowing in the FETs 202 and 204. The path 228 is the path of the gate current of the FET 202, the path 230 is the path of the drain current of the FET 202, the path 232 is the path of the gate current of the FET 204, and the path 234 is the path of the drain current of the FET 204.

FIG. 31 is a plan showing a capacitor used in a conventional amplifier. FIG. 32 is a sectional view of the capacitor shown in FIG. 31 along the dashed line 32—32.

Reference numeral 236 denotes an MIM capacitor. Such an MIM capacitor 236 is used as capacitors 218, 220, 222, 224, and 226 of the amplifier shown in FIG. 30.

In FIGS. 31 and 32, reference numeral 238 denotes a circuit substrate, 240 denotes a wiring layer, 242 denotes a lower electrode, 244 denotes a dielectric layer, 246 denotes an upper electrode, 248 denotes a connecting conductor, and 250 denotes a back conductor.

The amplifier 200 is normally formed as an MMIC (monolithic microwave integrated circuit), and all of the circuit elements are constituted on a semiconductor chip. Therefore, the MIM capacitors 236 used as capacitors 218, 220, 222, 224, and 226 must also be tested not to be defective. This test must include a withstand voltage test normally using a DC voltage, and is conducted by grounding one terminal of the capacitor, and impressing a voltage to the other terminal.

In the amplifier 200, the case is considered where a high voltage is impressed to the DC electrode 210 for conducting the withstand voltage test of the capacitor 218. At this time, the capacitor 218 and the FET 202 are in such a relationship as they are connected in parallel between the DC electrode 210 and the grounding end.

FIG. 33 is a schematic diagram showing an equivalent circuit of a capacitor and a transistor in a conventional amplifier.

In FIG. 33, reference numeral 252 denotes a DC electrode, for example the DC electrode 210. Reference numeral 254 denotes a capacitor, for example the capacitor 218. Reference numeral 256 denotes a resistor element, for example, the resistor component of the FET 202 is equivalently shown. Reference numeral 258 denotes a current path.

When a voltage is impressed to the DC electrode 210 to conduct the withstand voltage test of the capacitor 218, since the capacitor 218 and the FET 202 are connected in parallel relative to the grounding end, a current flows dominantly in the current path 258 as shown in the equivalent circuit of FIG. 33. Therefore, even if one tries to impress a voltage required for the withstand voltage test of the capacitor 218 corresponding to the capacitor 254, a large current flows in the FET 202 corresponding to the resistor element 256, and the withstand voltage test of the capacitor 218 cannot be conducted.

The same situations occur also in capacitors 220, 222, 224, and 226. Therefore, a method must be used wherein the operation test of the amplifier 200 is conducted for a long time to check the occurrence of defective capacitors before shipping. Consequently, it takes a long time for the manufacturing process of amplifiers, and defective products may be detected in the final process, resulting in an increase in the costs of the amplifiers.

Japanese Patent Laid-Open No. Hei 9(1997)-74144, corresponding to U.S. Pat. No. 5,801,413 discloses a semiconductor device comprising capacitance elements having an excellent area efficiency by constituting capacitors of the same constitution as the memory cell capacitors in a DRAM memory, and describes that the capacitance elements are connected in series, and a pad is provided on the connecting point in the middle, which is used as the testing pad for testing defective insulating films. However, this prior technique does not use MIM capacitors, and the connecting relationship with transistors is also different.

SUMMARY OF THE INVENTION

The present invention has been devised to solve the above problems.

According to one aspect of the invention, there is provided a semiconductor device comprising: a substrate having a main surface, an MIM capacitor having a first electrode layer disposed on the main surface of the substrate, second and third electrode layers facing the first electrode layer through a dielectric layer; a terminal pad connected to the first electrode layer of the MIM capacitor; a first terminal connected to the second electrode layer of the MIM capacitor; a second terminal connected to the third electrode layer of the MIM capacitor; and a first active element whose first electrode is connected to the second electrode layer of the MIM capacitor.

Accordingly, the withstand voltage test of MIM capacitors can be conducted without damaging the first active element, defective products can be eliminated in the early stages of the process, and the yield of the final products can be improved. In its turn, semiconductor devices of a high reliability can be provided at low costs.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the same elements are given the same reference numbers.

DESCRIPTION OF THE PREFERRED EMBODIMENTS

First Embodiment

Figure 1:
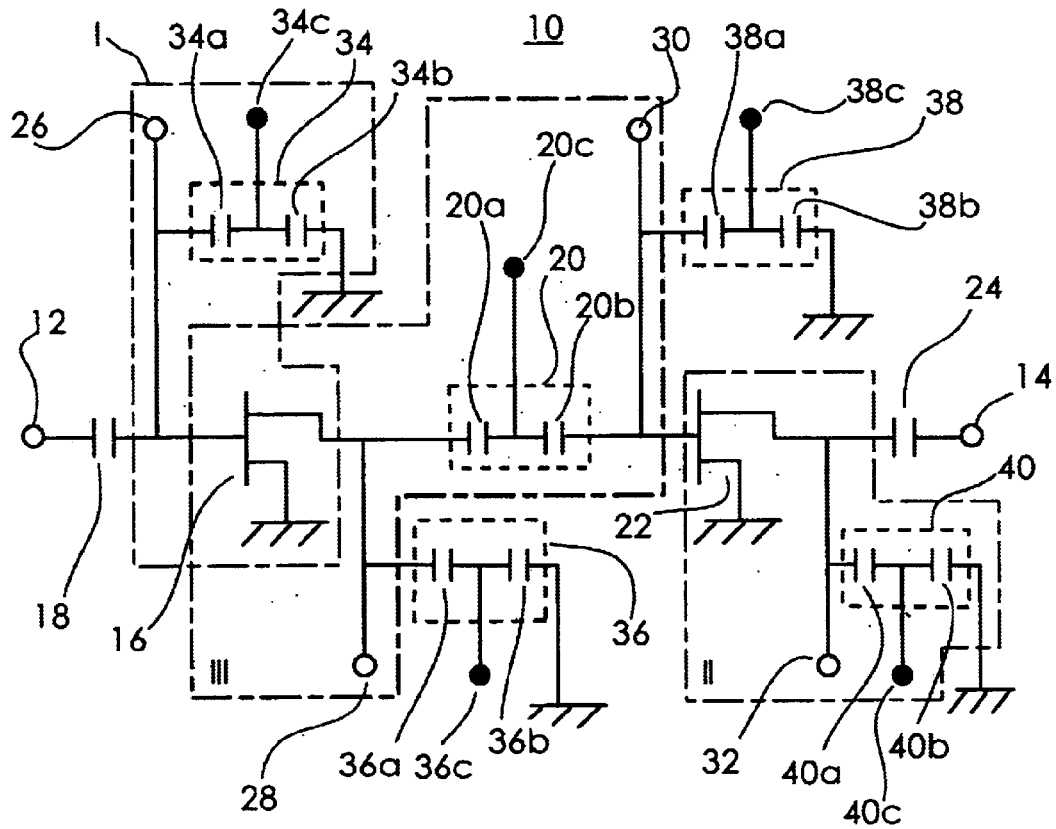
FIG. 1 is a circuit diagram, of an amplifier according to an embodiment of the present invention.

FIG. 1 is a circuit diagram of an amplifier according to an embodiment of the present invention.

In FIG. 1, reference numeral 10 denotes an amplifier of a two-stage constitution used in, for example, microwave communication equipment or cellular phones, and formed of MMICs and the like. In First Embodiment, although the amplifier is of a two-stage constitution, three-stage and higher-stage constitutions may also be used.

Reference numeral 12 denotes a signal input terminal, and 14 denotes a signal output terminal. Reference numeral 16 denotes an FET for first-stage amplification, whose gate electrode is connected to the signal input terminal 12 through a capacitor 18.

Reference numeral 20 denotes an MIM capacitor, which is constituted of a pair of MIM capacitors 20a and 20b connected in series, and a testing terminal 20c connected to the connecting point of the MIM capacitors 20a and 20b through a wiring layer (hereafter, the MIM capacitor of the constitution 20 surrounded by the broken lines in FIG. 1 is called "paired MIM capacitor").

Reference numeral 22 denotes an FET for output-stage amplification, whose gate electrode is connected to the drain electrode of the FET 16 for first-stage amplification through the MIM capacitors 20a and 20b of the paired MIM capacitor 20. The drain electrode of the FET 22 is connected to the signal output terminal 14 through a capacitor 24. Both the source electrodes of the FET 16 and the FET 22 are grounded.

Reference numerals 26, 28, 30, and 32 denote connecting terminals provided on the substrate of the MMIC whereon the amplifier 10 is formed. These connecting terminals are connected to the DC power source. The connecting terminal 26 is connected to the gate electrode of the FET 16; the connecting terminal 28 is connected to the drain electrode of the FET 16; the connecting terminal 30 is connected to the gate electrode of the FET 22; the connecting terminal 32 is connected to the drain electrode of the FET 22; and DC power is supplied to the electrodes of the FET 16 and the FET 22.

Reference numerals 34, 36, 38, and 40 denote paired MIM capacitors similar to the paired MIM capacitor 20.

The paired MIM capacitor 34 comprises a pair of MIM capacitors 34a and 34b connected in series, and a testing terminal 34c is connected to the connecting point of the MIM capacitors 34a and 34b through a wiring layer.

The paired MIM capacitor 36 comprises a pair of MIM capacitors 36a and 36b connected in series, and a testing terminal 36c is connected to the connecting point of the MIM capacitors 36a and 36b through a wiring layer.

The paired MIM capacitor 38 comprises a pair of MIM capacitors 38a and 38b connected in series, and a testing terminal 38c is connected to the connecting point of the MIM capacitors 38a and 38b through a wiring layer.

The paired MIM capacitor 40 comprises a pair of MIM capacitors 40a and 40b connected in series, and a testing terminal 40c is connected to the connecting point of the MIM capacitors 40a and 40b through a wiring layer.

The connecting terminal 26 is grounded through a pair of MIM capacitors 34a and 34b of the paired MIM capacitor 34; the connecting terminal 28 is grounded through a pair of MIM capacitors 36a and 36b of the paired MIM capacitor 36; the connecting terminal 30 is grounded through a pair of MIM capacitors 38a and 38b of the paired MIM capacitor 38; and the connecting terminal 32 is grounded through a pair of MIM capacitors 40a and 40b of the paired MIM capacitor 40.

The paired MIM capacitor 20 is a capacitor for separating amplifier stages, and is used for separating the DC power supplied from the connecting terminal 28 and the connecting terminal 30. Paired MIM capacitors 34, 36, 38, and 40 are provided for the purpose of releasing low frequency contained in the power supplied from connecting terminals 26, 28, 30, and 32 to the grounding terminal to reduce the effect of the DC power source on the RF properties of the FET 16 and the FET 22.

Figure 2:
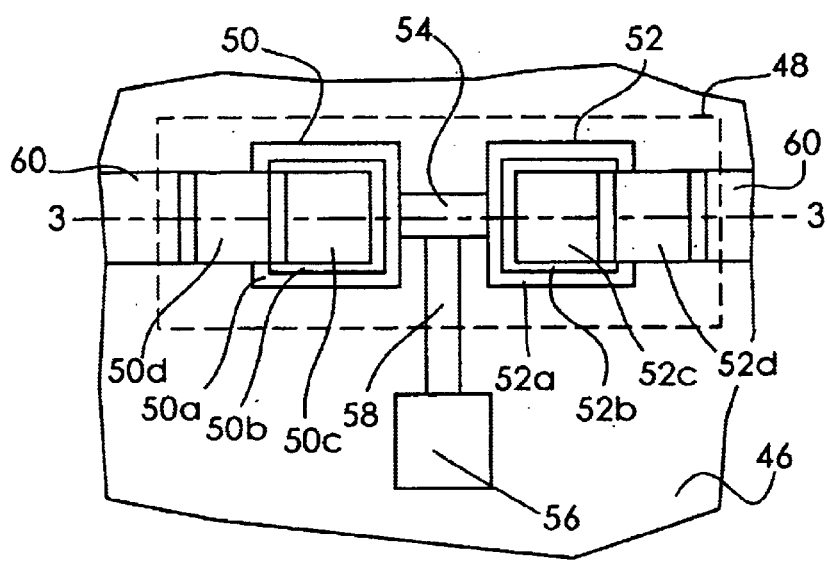
FIG. 2 is a plan view showing an MIM capacitor according to an embodiment of the present invention.
Figure 3:
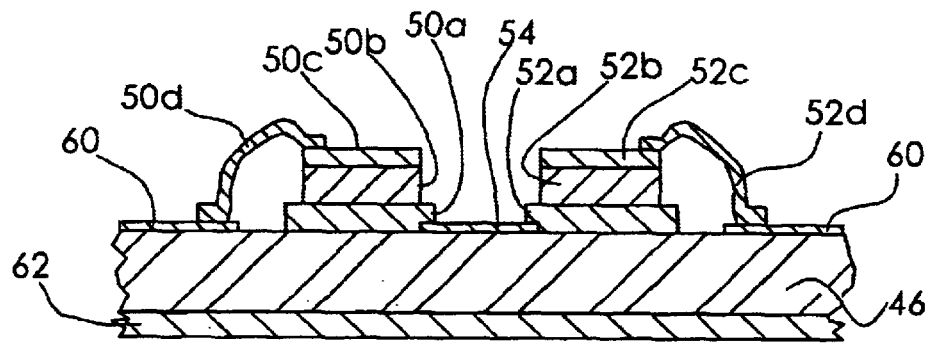
FIG. 3 is a sectional view of the MIM capacitor along the dashed line 3—3 in FIG. 2.
Figure 4:
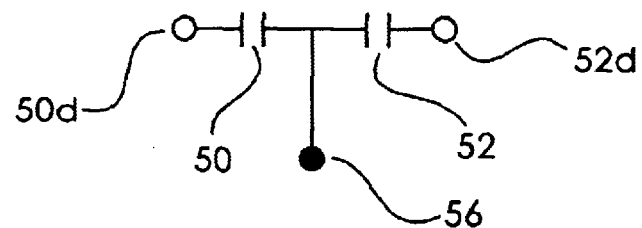
FIG. 4 is an equivalent circuit diagram of an MIM capacitor according to an embodiment of the present invention.

FIG. 2 is a plan showing an MIM capacitor according to an embodiment of the present invention. FIG. 3 is a sectional view of the MIM capacitor along the dashed line 3—3 in FIG. 2. FIG. 4 is an equivalent circuit diagram of an MIM capacitor according to an embodiment of the present invention.

In FIGS. 2, 3, and 4, the same reference numerals denote the same or corresponding components. This is also applied to other drawings.

In FIGS. 2 and 3, reference numeral 46 denotes a substrate, and an MIC (microwave integrated circuit) substrate, in MMIC, a semiconductor substrate, such as a GaAs substrate and an InP substrate, is used.

Reference numeral 48 in the area surrounded by broken lines denotes a paired MIM capacitor that corresponds to paired MIM capacitors 20, 34, 36, 38, and 40 in FIG. 1. Reference numeral 50 denotes an MIM capacitor formed on the substrate 46, and 52 denotes another MIM capacitor formed on the substrate 46. Reference numeral 54 denotes a wiring layer consisting of an Au film formed on the substrate 46, and 56 denotes a testing electrode pad as a terminal pad formed on the substrate 46, corresponding to the testing terminal in FIG. 1. Reference numeral 58 denotes another wiring layer consisting of an Au film formed on the substrate 46.

The paired MIM capacitor 48 comprises MIM capacitors 50 and 52, and a wiring layer 54 that interconnects the MIM capacitors 50 and 52.

The MIM capacitor 50 is formed on the substrate 46, and has a lower metal 50a as a first electrode layer consisting for example of Ti/Au/Mo, a dielectric film 50b as a dielectric layer consisting for example of SiN or SiO$_2$ formed on the lower metal 50a, an upper metal 50c as a second electrode layer consisting of Ti/Au/Mo formed on the dielectric film 50b, and a connecting terminal 50d consisting of an Au film.

The MIM capacitor 52 is formed on the substrate 46 as a first electrode layer, and has a lower metal 52a as a first electrode layer consisting for example of Ti/Au/Mo, a dielectric film 52b as a dielectric layer consisting for example of SiN or SiO$_2$ formed on the lower metal 52a, an upper metal 52c as a third electrode layer consisting of Ti/Au/Mo formed on the dielectric film 52b, and a connecting terminal 52d consisting of an Au film.

The lower metal 50a of the MIM capacitor 50 and the lower metal 52a of the MIM capacitor 52 are connected with each other by the wiring layer 54, and are also connected to the testing electrode pad 56 by the wiring layer 54 and the wiring layer 58.

The connecting terminals 50d and 52d are connected to the wiring layer 60 formed of an Au film on the substrate.

The dimensions of the lower metals 50a and 52a depend on the capacity of the capacitors, and are, for example, from about 10 $\mu$m×10 $\mu$m to about 500 $\mu$mn×500 $\mu$m.

The thickness of the dielectric films 50b and 52b is, for example, about 2000 Å. The width of the wiring layers 54 and 58 is 100 $\mu$mn or less, for example about 5 to 20 $\mu$m.

The dimensions of the testing electrode pad 56 are, for example, about 100 $\mu$m×100 $\mu$m.

In the equivalent circuit shown in FIG. 4, the reference numerals denoting the elements of the equivalent circuit correspond to the elements shown in FIGS. 2 and 3.

On the circuit of the amplifier 10 in FIG. 1, when the paired MIM capacitor 34, the connecting terminal 26, and the FET 16 in the region I surrounded by dash and dotted lines are selected as the first case, the paired MIM capacitor 34 corresponds to the MIM capacitor, the connecting terminal 26 corresponds to the first terminal, the FET 16 corresponds to the first active element, and the second terminal corresponds to the grounding terminal. This relationship is the same when the paired MIM capacitor 38, the connecting terminal 30, and the FET 22 are selected.

When the paired MIM capacitor 40, the connecting terminal 32, and the FET 22 in the region II surrounded by dash and dotted lines are selected as the second case, the paired MIM capacitor 40 corresponds to the MIM capacitor, the connecting terminal 32 corresponds to the first terminal, the FET 22 corresponds to the first active element, and the second terminal corresponds to the grounding terminal. This relationship is the same when the paired MIM capacitor 36, the connecting terminal 28, and the FET 16 are selected.

When the paired MIM capacitor 20, the connecting terminal 28, the FET 16, and the connecting terminal 30 in the region III surrounded by dash and dotted lines are selected as the third case, the paired MIM capacitor 20 corresponds to the MIM capacitor, the connecting terminal 28 corresponds to the first terminal, the FET 16 corresponds to the first active element, and the second terminal corresponds to the connecting terminal 30.

If an FET 22 is added to the third case, the FET 22 corresponds to the second active element.

The test of the paired MIM capacitor 48 is conducted by connecting the connecting terminals (connecting terminals 26, 28, 30, 32, and the like in FIG. 1) on the substrate whereto the connecting terminal 50d or 52d is connected through the wiring layer 60 to the grounding end. For example, when the withstand voltage test of the capacitor 50 is conducted, the capacitor 50 is grounded through the connecting terminal 5d; and when the withstand voltage test of the capacitor 52 is conducted, the capacitor 52 is grounded through the connecting terminal 52d.

Figure 5:
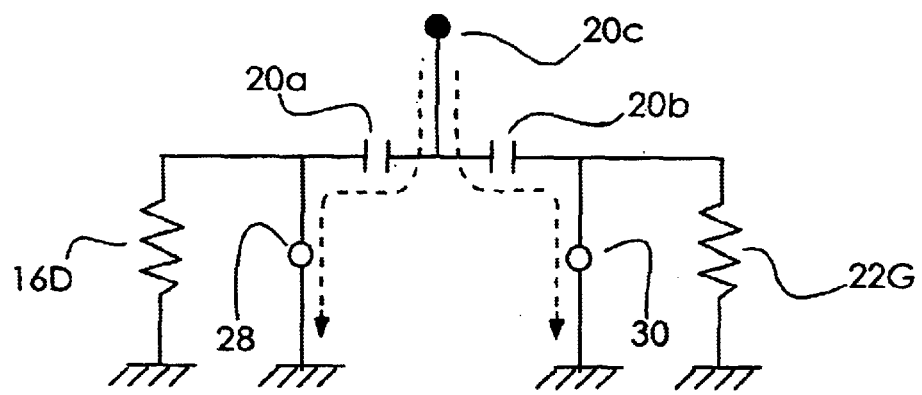
FIG. 5 is a schematic diagram illustrating the withstand voltage test of MIM capacitors according to the present invention.

FIG. 5 is a schematic diagram illustrating the withstand voltage test of MIM capacitors according to the present invention.

FIG. 5 shows, as an example, an FET 16 whose resistor component is equivalently represented by a resistor element, a grounded connecting terminal 28, a paired capacitor 20, a grounded connecting terminal 30, and an FET 22 whose resistor component is equivalently represented by a resistor element.

In FIG. 5, reference numeral 16D denotes the drain resistor component of the FET 16, and 22G denotes the gate resistor component of the FET 22.

The withstand voltage test of the capacitors 20a and 20b is conducted by grounding the connecting terminals 28 and 30, and impressing a voltage to the testing terminal 20c. Here, since the capacitor 20a and the drain resistor component 16D of the FET 16, and the capacitor 20b and the gate resistor component 22G of the FET 22 are connected in series, a large current does not flow in the FET 16 and the FET 22 basically even if a high voltage required for the withstand voltage test of capacitors is impressed to the testing terminal 20c.

Even if a capacitor is defective, and a current flows, the current flows dominantly in the connecting terminals 28 and 30 grounded in parallel to the FET 16 and the FET 22, and the FET 16 and the FET 22 are not damaged similarly to the current path indicated by the broken lines in FIG. 5.

Although the above-described third case wherein the FET 22 is added to the circuit elements in the region III is described here, the withstand voltage test can also be conducted by grounding the connecting terminals 26, 28, 30, and 32 in the first case and the second case; and the withstand voltage test of 34a and 34b, 36a and 36b, 38a and 38b, and 40a and 40b can be conducted without damaging the FET 16 and the FET 22.

As described above, by providing a paired MIM capacitor which is connected to a testing electrode as the MIM capacitor for separating amplifier stages and the MIM capacitor provided in the DC power terminal for supplying DC power of the FET, the withstand voltage test of an MIM capacitor can be conducted without damaging active elements. Therefore, defective products can be eliminated in the early stage of the process, and the yield of final products can be improved. In its turn, semiconductor devices of high reliability can be provided at low costs.

Second Embodiment

Second Embodiment is a modification of the amplifier 10 shown in FIG. 1 by changing the constitution of the paired MIM capacitor leaving the circuit constitution unchanged. In other words, a circuit element for impedance adjustment is provided between the wiring layer 54 for interconnecting the capacitors 50 and 52 and the testing electrode pad 56, inclusive of making the testing electrode pad 56 thereof into the circuit element for impedance adjustment.

Figure 6:
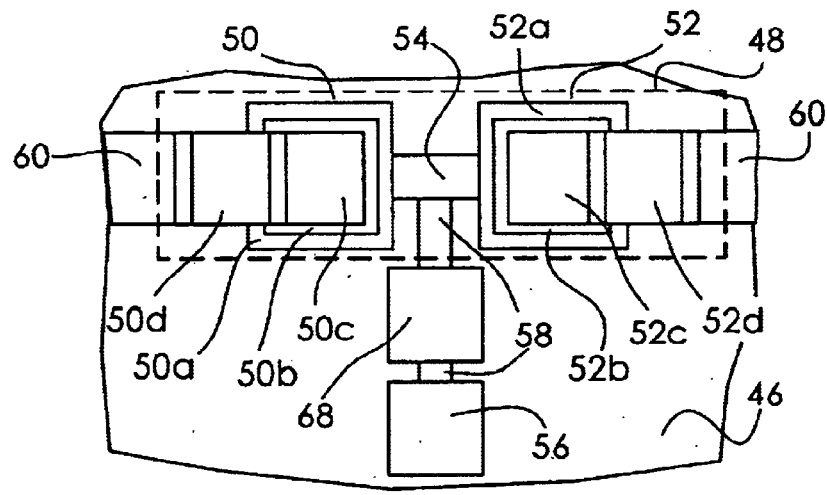
FIG. 6 is a plan view showing an MIM capacitor according to an embodiment of the present invention.
Figure 7:
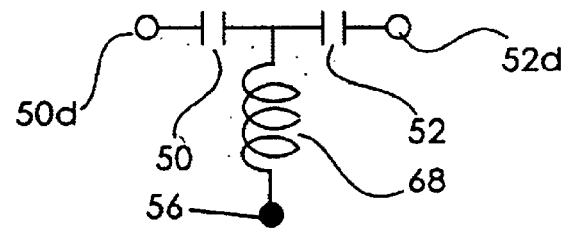
FIG. 7 is an equivalent circuit diagram of the MIM capacitor shown in FIG. 6.

FIG. 6 is a plan showing an MIM capacitor according to an embodiment of the present invention. FIG. 7 is an equivalent circuit diagram of the MIM capacitor shown in FIG. 6.

In FIG. 6, reference numeral 68 denotes an inductor as an impedance-adjusting element, for example, a spiral inductor. An end of the inductor 68 is connected to the lower metals 50a and 52a of capacitors 50 and 52, respectively, through the wiring layer 58 and the wiring layer 54, and the other end of the inductor 68 is connected to the testing electrode pad 56 through the wiring layer 58.

Although the method for the withstand voltage test of capacitors 50 and 52 is the same as that described in First Embodiment, the effect of forming the testing electrode pad 56 on the RF properties of the amplifier 10 can be reduced by adequately adjusting the inductance value. In its turn, a semiconductor device wherein the degradation of the RF properties of the amplifier 10 is prevented while having a testing electrode pad can be provided.

MODIFIED EXAMPLE 1

Modified Example 1 is a paired MIM capacitor using a resistor element as the circuit element for adjusting impedance.

Figure 8:
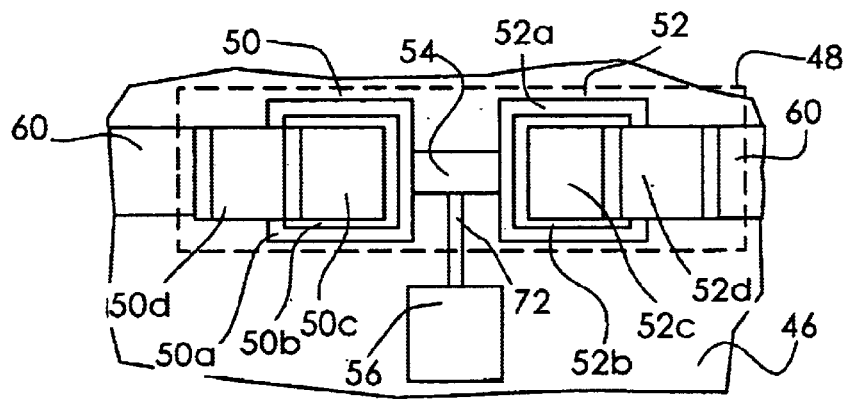
FIG. 8 is a plan view showing a modified example of an MIM capacitor according to a Second Embodiment of the present invention.
Figure 9:
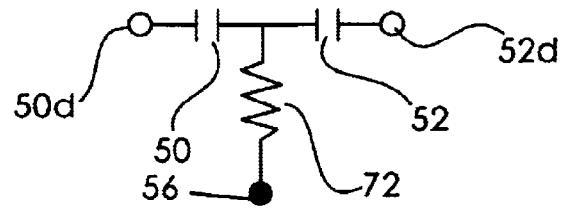
FIG. 9 shows an equivalent circuit of the MIM capacitor shown in FIG. 8.

FIG. 8 is a plan showing a modified example of an MIM capacitor according to Second Embodiment of the present invention. FIG. 9 shows an equivalent circuit of the MIM capacitor shown in FIG. 8.

In FIG. 8, reference numeral 72 denotes a resistor element formed by, for example, driving ions into a substrate.

An end of the resistor element 72 is connected to the lower metals 50a and 52a of capacitors 50 and 52, respectively, through the wiring layer 54, and the other end of the resistor element 72 is connected to the testing electrode pad 56.

In Modified Example 1, the effect of forming the testing electrode pad 56 on the RF properties of the amplifier 10 can also be reduced by adjusting the resistance value of the resistor element 72 to be sufficiently high.

MODIFIED EXAMPLE 2

Modified Example 2 is a paired MIM capacitor wherein the testing electrode pad 56 itself is constituted of a transmission line as the circuit element for adjusting impedance, for example, of a micro-strip line.

Figure 10:
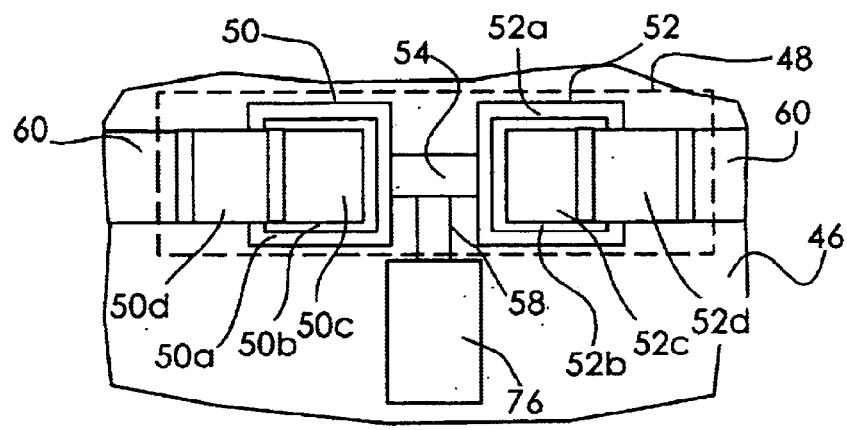
FIG. 10 is a plan view showing a modified example of an MIM capacitor according to the Second Embodiment of the present invention.
Figure 11:
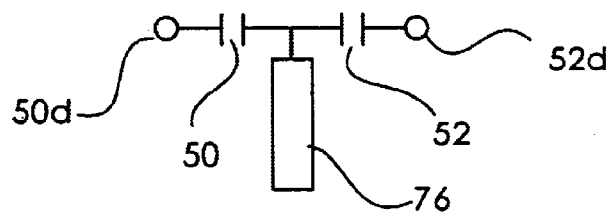
FIG. 11 is an equivalent circuit diagram of the MIM capacitor shown in FIG. 10.

FIG. 10 is a plan showing a modified example of an MIM capacitor according to Second Embodiment of the present invention. FIG. 11 is an equivalent circuit diagram of the MIM capacitor shown in FIG. 10.

In FIG. 10, reference numeral 76 denotes a transmission line used as a testing electrode pad and a circuit for adjusting impedance.

The width of the transmission line 76 is, for example, 100 $\mu$m, and the length of the transmission line 76 is, for example, about 500 $\mu$m. By changing the dimensions of the transmission line 76, an open stub for adjusting impedance is formed, and the effect of adjusting the RF properties of the amplifier 10 can be achieved.

Third Embodiment

Third Embodiment is a modification of the amplifier 10 shown in FIG. 1 by changing the constitution of the paired MIM capacitor leaving the circuit constitution unchanged. In the paired MIM capacitor according to Third Embodiment, a lower metal is integrally formed, a dielectric film provided thereon is also integrally formed, and two upper metals formed on the dielectric film are separately formed and placed in parallel.

Figure 12:
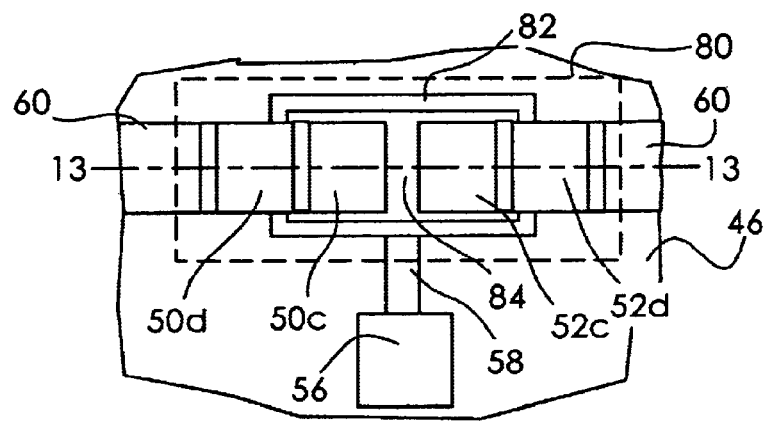
FIG. 12 is a plan view of an MIM capacitor according to an embodiment of the invention.
Figure 13:
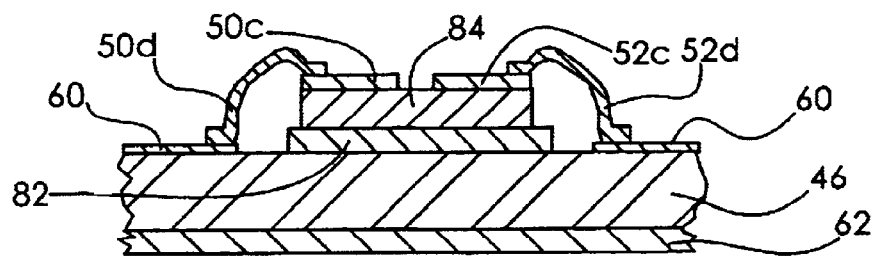
FIG. 13 is a sectional view of the MIM capacitor along the dashed line 13—13 in FIG. 12.

FIG. 12 is a plan of an MIM capacitor according to an embodiment of the invention. FIG. 13 is a sectional view of the MIM capacitor along the dashed line 13—13 in FIG. 12.

In FIG. 12, reference numeral 80 denotes a paired MIM capacitor, 82 denotes the lower metal of the paired MIM capacitor 80, and 84 denotes a dielectric film disposed on the lower metal 82. The lower metals 50a and 52a of the paired MIM capacitor 48 are integrated to the lower metal 82, and the dielectric films 50 band 52b of the paired MIM capacitor 48 are integrated to the dielectric film 84; however, the upper metal provided on the dielectric film is separated into the upper metals 50c and 52c placed in parallel.

Since a testing electrode pad 56 is connected to the lower metal 82 through a wiring layer 58, the circuit of the paired MIM capacitor 48 wherein a pair of MIM capacitors are connected in series, and a testing electrode pad 56 is connected to the connecting point is the same as the circuit of the paired MIM capacitor 80 of Third Embodiment. Therefore, the method for the withstand voltage test of two capacitors constituting the circuit of the paired MIM capacitor 80 is the same as the method in First Embodiment.

However, since the wiring layer 54 for connecting the lower metals 50a and 52a provided to the paired MIM capacitor 48 is not required because the lower metal 82 of the paired MIM capacitor 80 of Third Embodiment is integrally formed, the installation area can be reduced, and the RF properties of the amplifier 10 can be improved. In its turn, a small amplifier 10 having favorable RF properties can be constituted.

Figure 14:
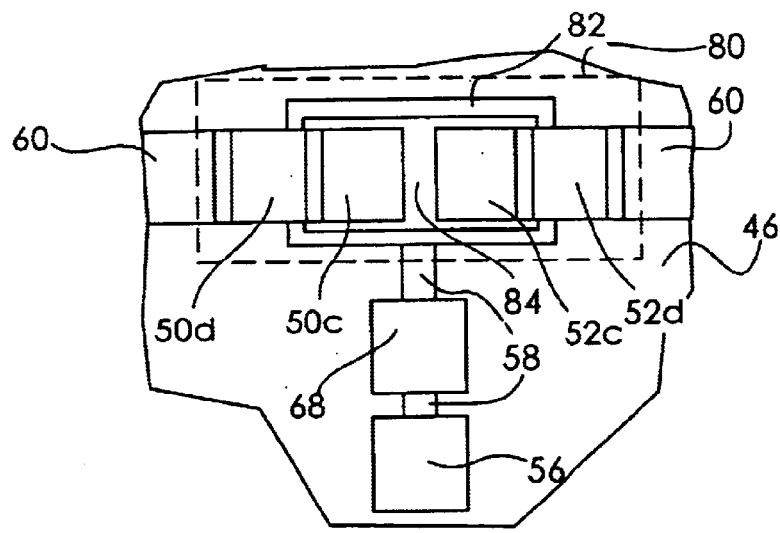
FIGS. 14, 15, and 16 are plan views showing modified examples of the MIM capacitor according to a Third Embodiment of the present invention.
Figure 15:
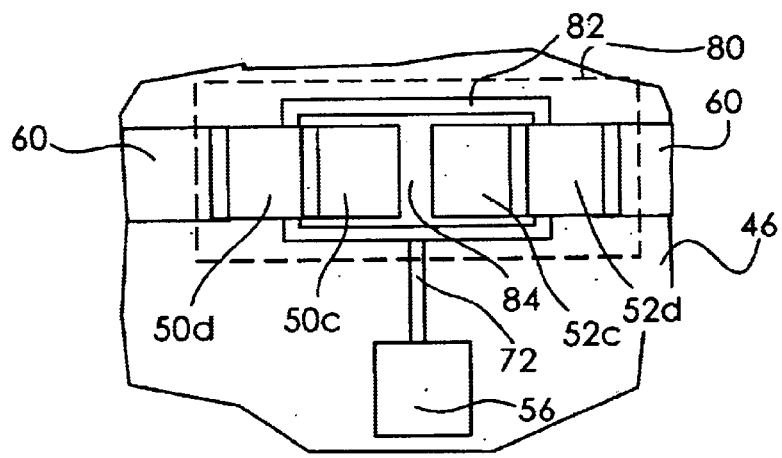
Figure 16:
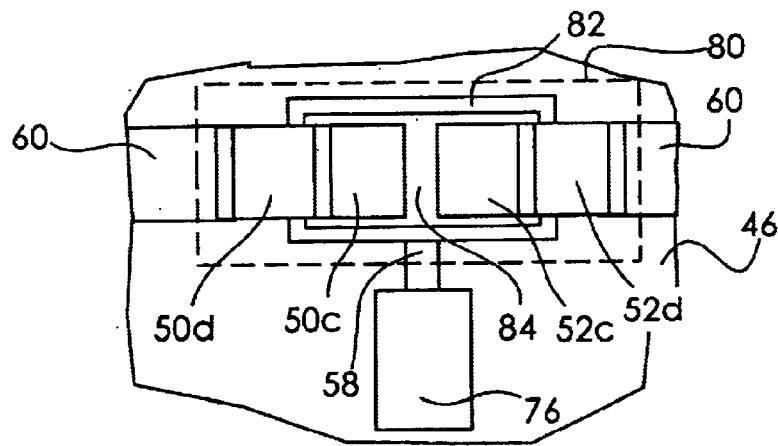

FIGS. 14, 15, and 16 are plans showing modified examples of the MIM capacitor according to Third Embodiment of the present invention.

The constitutions of MIM capacitors in FIGS. 14, 15, and 16 are similar to the constitution of Second Embodiment, and a circuit element for impedance adjustment is provided between the testing electrode pad 56 and the lower metal 82, including the adjustment of the impedance of the testing electrode pad 56. Similarly to Second Embodiment, the effect of the testing electrode pad 56 on the RF properties of the amplifier 10 can be reduced by adequately adjusting the value of the impedance.

Fourth Embodiment

Fourth Embodiment is a modification of the amplifier 10 shown in FIG. 1 by changing the constitution of the paired MIM capacitor leaving the circuit constitution unchanged. In the paired MIM capacitor according to Fourth Embodiment, a lower metal is integrally formed, a dielectric film provided thereon is also integrally formed, two upper metals formed on the dielectric film are separately formed and placed in parallel, and the upper metals are comb-shaped that engage with each other.

Figure 17:
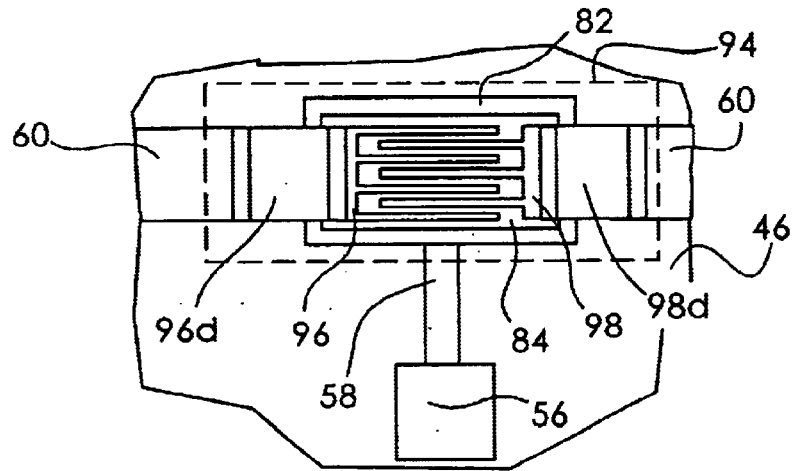
FIG. 17 is a plan view showing an MIM capacitor according to an embodiment of the present invention.
Figure 18:
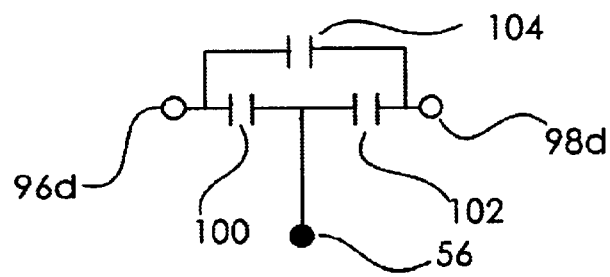
FIG. 18 is an equivalent circuit diagram of the MIM capacitor shown in FIG. 17.

FIG. 17 is a plan showing an MIM capacitor according to an embodiment of the present invention. FIG. 18 is an equivalent circuit diagram of the MIM capacitor shown in FIG. 17.

In FIG. 17, reference numeral 94 denotes a paired MIM capacitor, 96 denotes a first comb-shaped upper metal as a second electrode layer, and 98 denotes a second comb-shaped upper metal as a third electrode layer. Both the first comb-shaped upper metal 96 and the second comb-shaped upper metal 98 are placed adjacently in parallel on the surface of the dielectric film 84 with the teeth of the combs engaging with each other.

Therefore, in addition to the capacity of the capacitor 100 produced by the first comb-shaped upper metal 96 facing lower metal 82 and the capacity of the capacitor 102 produced by the second comb-shaped upper metal 98 facing lower metal 82, capacity 104 between the first comb-shaped upper metal 96 and the second comb-shaped upper metal 98 is also produced.

In the paired MIM capacitor 94 of Fourth Embodiment, since the testing electrode pad 56 is connected to the lower metal 82 through the wiring layer 58, the circuit of the paired MIM capacitor 48 of First Embodiment wherein a pair of MIM capacitors are connected in series, and a testing electrode pad 56 is connected to the connecting point is the same as the circuit of the paired MIM capacitor 94 of Fourth Embodiment when the withstand voltage test is conducted. Therefore, the method for the withstand voltage test of two capacitors 100 and 102 constituting the circuit of the paired MIM capacitor 94 is the same as the method in First Embodiment.

As FIG. 18 shows, although the capacitor 100 is connected to the capacitor 102 in series, the capacity 104 is equivalently connected in parallel to the capacitor 100 and the capacitor 102.

Therefore, in the paired MIM capacitor 94, even though the installation area of the lower metal 82 is the same, the capacity is larger than the capacity of the paired MIM capacitor 80 in Third Embodiment, and the size of the paired MIM capacitor can be reduced. Therefore, the RF properties of the amplifier 10 can be improved. In its turn, a small amplifier 10 having favorable RF properties can be constituted.

Figure 19:
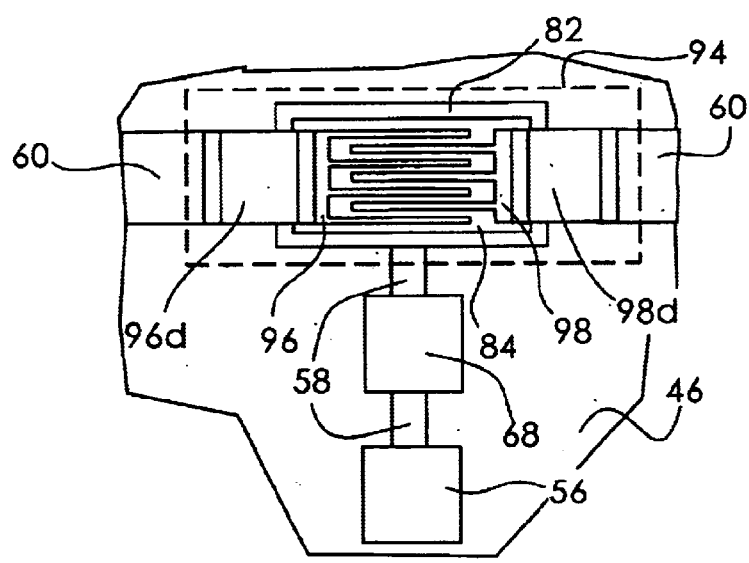
FIGS. 19, 20, and 21 are plan views showing the modified examples of MIM capacitors according to a Fourth Embodiment of the present invention.
Figure 20:
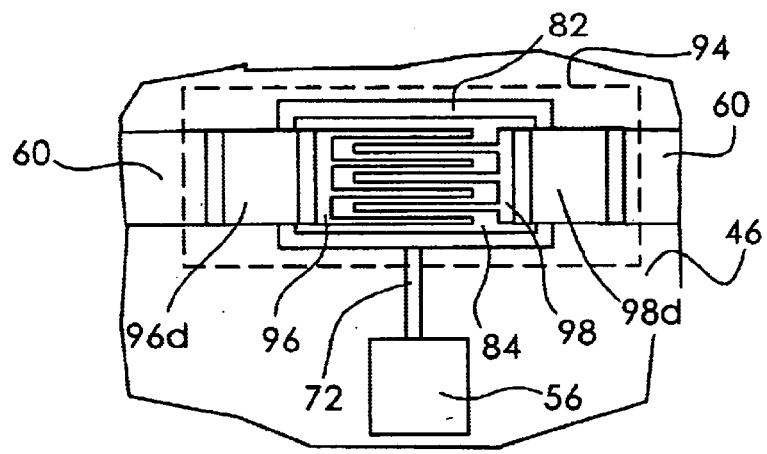
Figure 21:
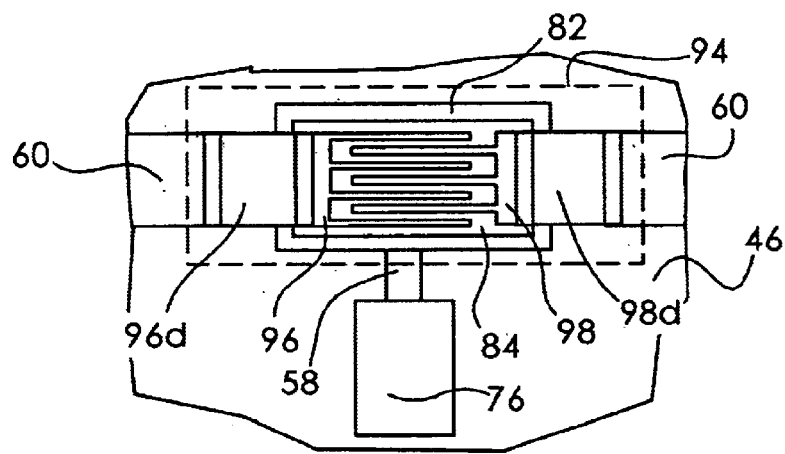

FIGS. 19, 20, and 21 are plans showing the modified examples of MIM capacitors according to Fourth Embodiment of the present invention.

The constitutions of MIM capacitors in FIGS. 19, 20, and 21 are similar to the constitution of Second Embodiment, and a circuit element for impedance adjustment is provided between the testing electrode pad 56 and the lower metal 82, including the adjustment of the impedance of the testing electrode pad 56. similarly to Second Embodiment, the effect of the testing electrode pad 56 on the RF properties of the amplifier 10 can be reduced by adequately adjusting the value of the impedance.

Fifth Embodiment

Fifth Embodiment is a modification of the amplifier 10 shown in FIG. 1 by changing the constitution of the paired MIM capacitor leaving the circuit constitution unchanged. In the paired MIM capacitor according to Fifth Embodiment, a lower metal, a first dielectric film, a metal between dielectric films, a second dielectric film, and an upper metal are piled and laminated; the lower metal and the upper metal are connected to the wiring layer; and a testing electrode pad is connected to the metal between dielectric films. Thereby an MIM capacitor constituted of the lower metal, the first dielectric film, and the metal between dielectric films, and the other MIM capacitor constituted of the metal between dielectric films , the second dielectric film, and the upper metal are connected in series by the metal between dielectric films to form a paired MIM capacitor; and the metal between dielectric films is connected to the testing electrode pad.

Figure 22:
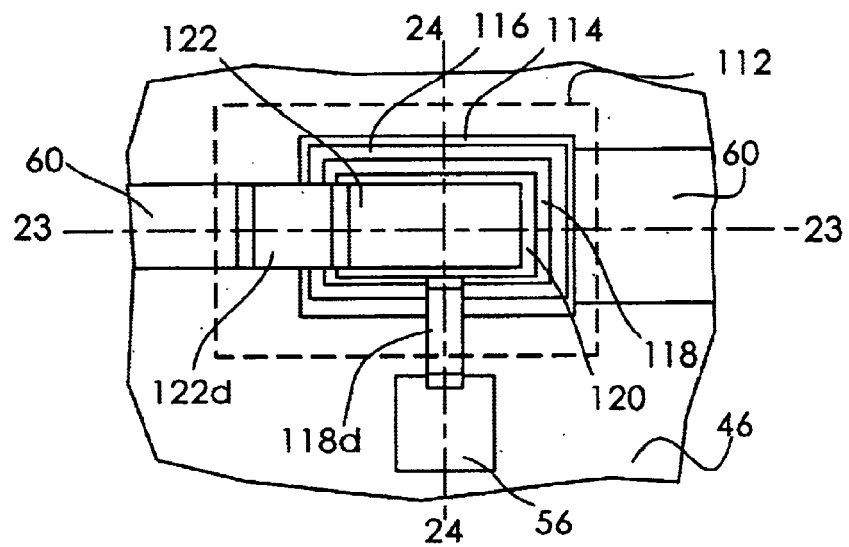
FIG. 22 is a plan view showing an MIM capacitor according to an embodiment of the present invention.
Figure 23:
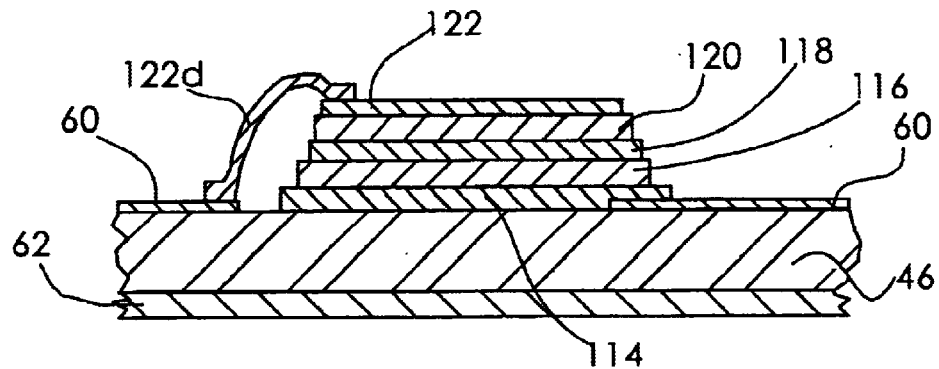
FIG. 23 is a sectional view of the MIM capacitor along the dashed line 23—23 in FIG. 22.
Figure 24:
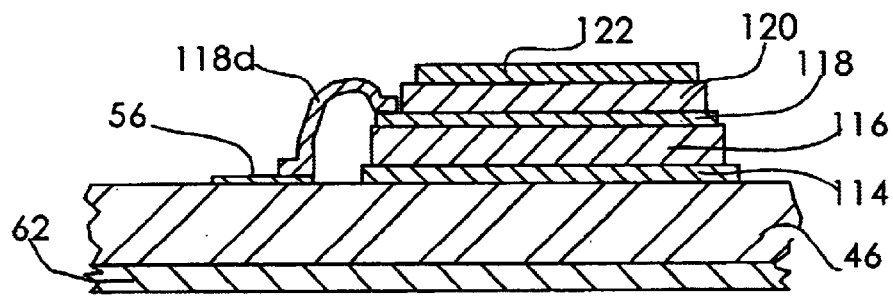
FIG. 24 is a sectional view of the MIM capacitor along the dashed line 24—24 in FIG. 22.

FIG. 22 is a plan showing an MIM capacitor according to an embodiment of the present invention. FIG. 23 is a sectional view of the MIM capacitor along the dashed line 23—23 in FIG. 22. FIG. 24 is a sectional view of the MIM capacitor along the dashed line 24—24 in FIG. 22.

In FIGS. 22, 23, and 24, reference numeral 112 denotes a paired MIM capacitor, and 114 denotes a lower metal as the second electrode layer disposed on the surface of a substrate 46 and directly connected to a wiring layer 60. Reference 116 denotes a first dielectric film disposed on the surface of the lower metal 114 as the dielectric layer. Reference numeral 118 denotes a metal between dielectric films as the first electrode layer disposed on the surface of the first dielectric film 116. Reference numeral 118d denotes a connecting terminal that connects the metal between dielectric films 118 to the testing electrode pad 56. Reference numeral 120 denotes a second dielectric film as the dielectric layer disposed on the surface of the metal between dielectric films 118. Reference numeral 122 denotes an upper metal as the third electrode layer disposed on the surface of the second dielectric film 120. Reference numeral 122d denotes a connecting terminal that connects the upper metal 122 to the wiring layer 60.

The lower metal 114, the first dielectric film 116, the metal between dielectric films 118, the second dielectric film 120, and the upper metal 122 are sequentially laminated so as to overlap each other. The lower metal 114, the metal between dielectric films 118, and the upper metal 122 are composed of, for example, Ti/Au/Mo as in the paired MIM capacitor 48 in First Embodiment. The first dielectric film 116 and the second dielectric film 120 are also formed for example of SiN or SiO$_2$ as in the paired MIM capacitor 48. The connecting terminal 118d and the connecting terminal 122d are also formed of an Au film as in the paired MIM capacitor 48.

In the paired MIM capacitor 112 thus constituted, since the MIM capacitor constituted of the lower metal 114, the first dielectric film 116, and the metal between dielectric films 118 is connected in series by the metal between dielectric films 118 with the other MIM capacitor constituted of the metal between dielectric films 118, the second dielectric film 120, and the upper metal 122; and the metal between dielectric films 118 is connected to the testing electrode pad 56, the equivalent circuit thereof is the same as the equivalent circuit of the paired MIM capacitor 48 in First Embodiment shown in FIG. 4. Therefore the withstand voltage test of the two MIM capacitors that constitute the paired MIM capacitor 112 can be conducted in the same manner as in First Embodiment.

Since the installation area in the paired MIM capacitor 112 can be reduced by piling the two MIM capacitors, and the material and the thickness of the first dielectric film 116 and the second dielectric film 120 can be changed in the manufacturing process more easily than the paired MIM capacitor 48 in First Embodiment, the freedom of the design of the capacitor can be elevated. Therefore, the size reduction of paired MIM capacitors, and the optimization of capacities can be achieved, and the RF properties of the amplifier 10 can be improved. In its turn, a small amplifier 10 having favorable RF properties can be constituted.

Figure 25:
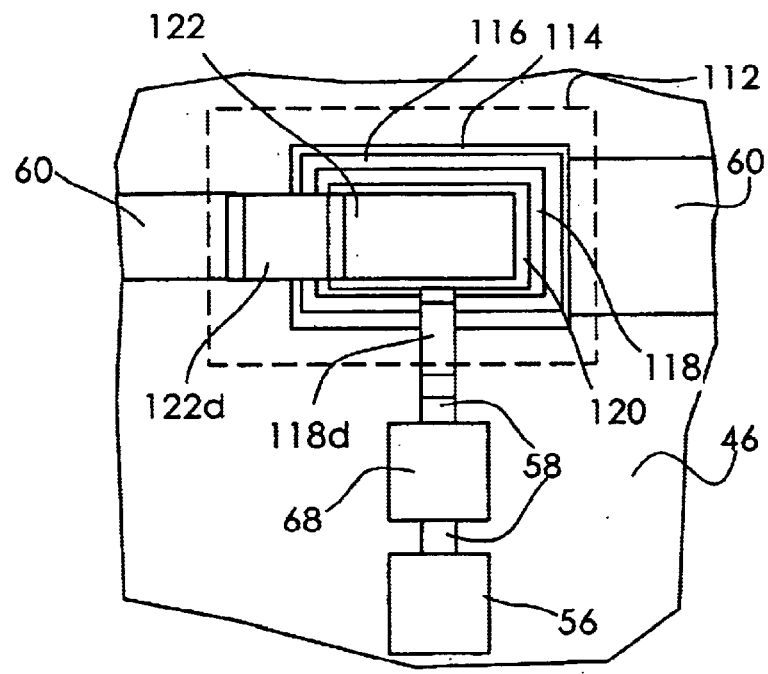
FIGS. 25, 26, and 27 are plan views showing the modified examples of MIM capacitors according to a Fifth Embodiment of the present invention.
Figure 26:
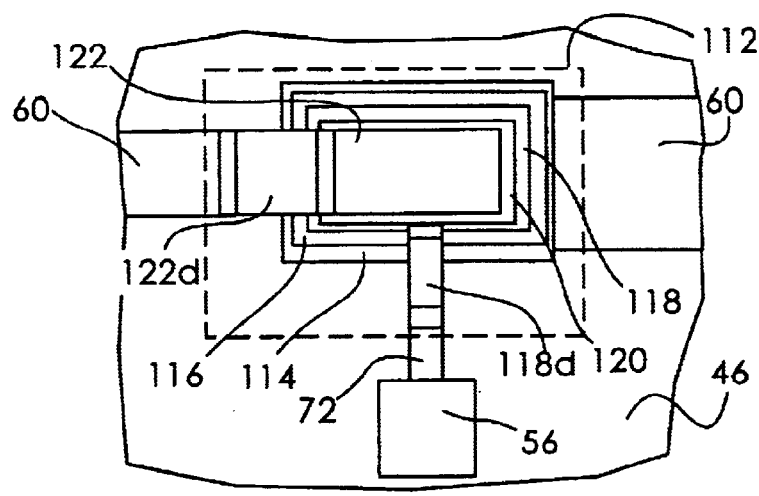
Figure 27:
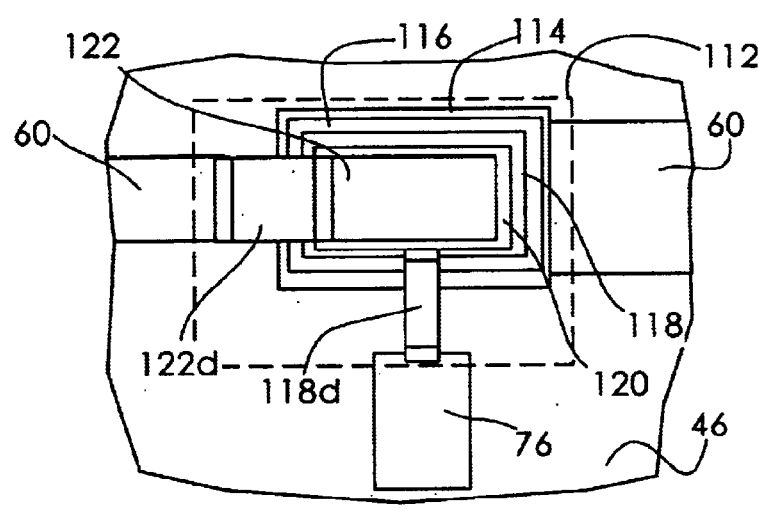

FIGS. 25, 26, and 27 are plans showing the modified examples of MIM capacitors according to Fifth Embodiment of the present invention.

The constitutions of MIM capacitors in FIGS. 25, 26, and 27 are similar to the constitution of Second Embodiment, and a circuit element for impedance adjustment is provided between the testing electrode pad 56 and the metal between dielectric films 116, including the adjustment of the impedance of the testing electrode pad 56. Similarly to Second Embodiment, the effect of the testing electrode pad 56 on the RF properties of the amplifier 10 can be reduced by adequately adjusting the value of the impedance.

Sixth Embodiment

Sixth Embodiment is a modification of the amplifier 10 shown in FIG. 1 by changing the constitution of the paired MIM capacitor leaving the circuit constitution unchanged. In the paired MIM capacitor according to Sixth Embodiment, a lower metal is integrally formed, a dielectric film provided thereon is also integrally formed, two upper metals formed on the dielectric film are separately formed and placed in parallel, a through-hole is formed in the dielectric film so as to expose the lower metal between the two upper metals, and a testing electrode pad is provided on the exposed surface of the lower metal through the through-hole.

Figure 28:
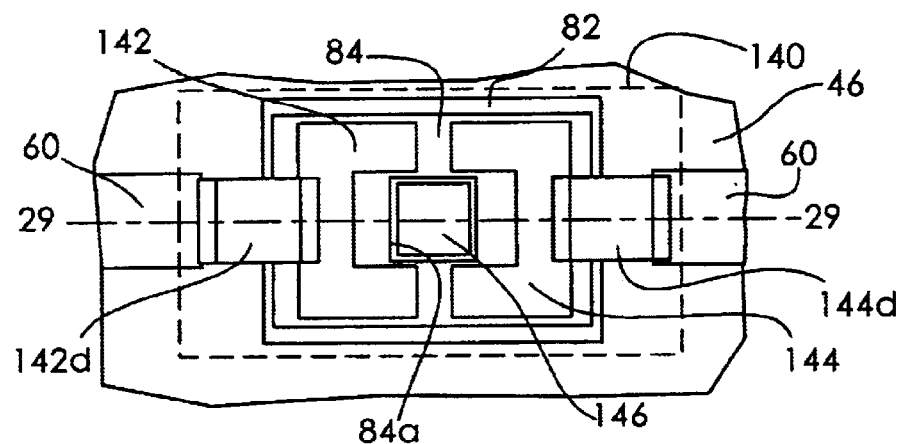
FIG. 28 is a plan view showing an MIM capacitor according to an embodiment of the present invention.
Figure 29:
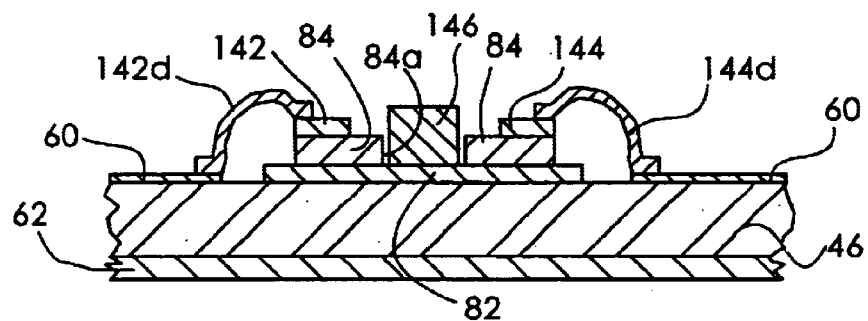
FIG. 29 is a sectional view of the MIM capacitor along the dashed line 29—29 in FIG. 28.
Figure 30:
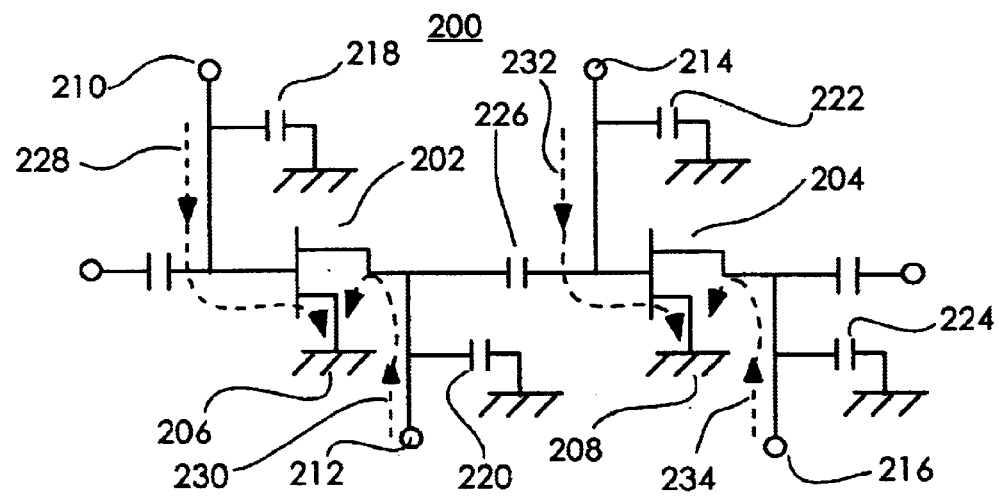
FIG. 30 is a circuit diagram of a conventional amplifier.
Figure 31:
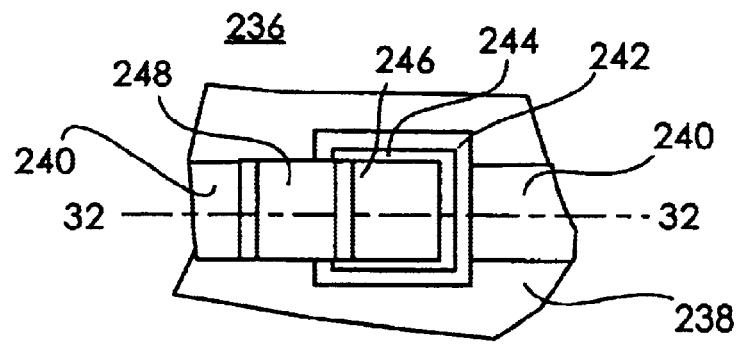
FIG. 31 is a plan view showing a capacitor used in a conventional amplifier.
Figure 32:
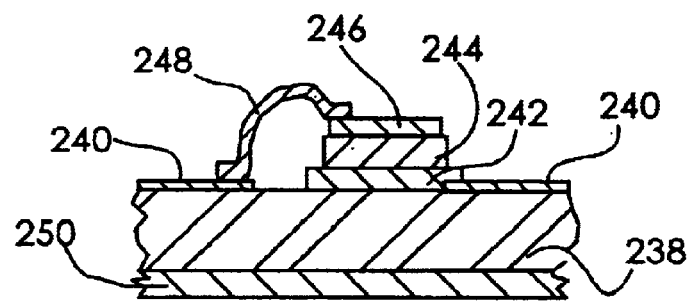
FIG. 32 is a sectional view of the capacitor shown in FIG. 31 along the dashed line 32—32.
Figure 33:
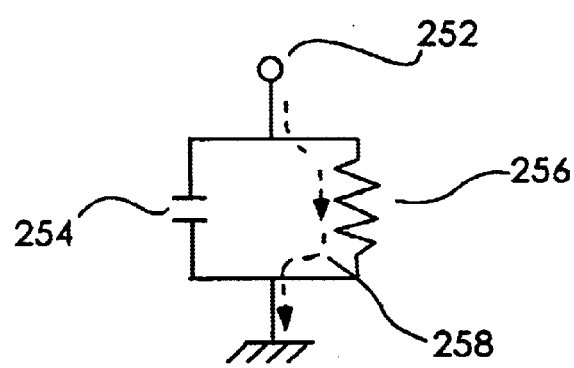
FIG. 33 is a schematic diagram showing an equivalent circuit of a capacitor and a transistor in a conventional amplifier.

FIG. 28 is a plan showing an MIM capacitor according to an embodiment of the present invention. FIG. 29 is a sectional view of the MIM capacitor along the dashed line 29—29 in FIG. 28.

In FIGS. 28 and 29, reference numeral 140 denotes a paired MIM capacitor, 142 denotes an upper metal as the second electrode layer, 142d denotes a connecting terminal, 144 denotes an upper metal as the third electrode layer, and 144d denotes a connecting terminal. The upper metal 142 and the upper metal 144 are disposed on the surface of the dielectric film 84 in parallel. A through-hole 84a is provided in the dielectric film 84 between the upper metal 142 and the upper metal 144, wherein a part of the lower metal 82 is exposed. A testing electrode pad 146 is disposed on the exposed surface of the lower metal through the through-hole 84a.

Since the testing electrode pad 146 intervenes between the upper metal 142 and the upper metal 144, the upper metal 142 and the upper metal 144 expand both the wings thereof so as to surround the testing electrode pad 146 to widen the area facing the lower metal 82. The materials and constitutions of the upper metal 142, the upper metal 144, and the testing electrode pad 146 are the same as the materials and constitutions in First Embodiment.

Since the paired MIM capacitor 140 has the same equivalent circuit as the equivalent circuit shown in FIG. 4 of First Embodiment, the withstand voltage test of the MIM capacitor formed of the lower metal 82, the dielectric film 84, and the upper metal 142; and the MIM capacitor formed of the lower metal 82, the dielectric film 84, and the upper metal 144 can be conducted in the same manner as in First Embodiment.

In the paired MIM capacitor 140, since the testing electrode pad 146 is directly disposed on the lower metal 82, no wiring layer that connects the paired MIM capacitor 140 to the testing electrode pad 146 is required. Therefore, no area for installing the wiring layer that connects the testing electrode pad 146 is required, and the substrate area of the amplifier 10 can be reduced. In its turn, the size reduction of the amplifier 10 can be reduced.

In the description of the embodiments, although FETs are described, it is needless to say that the present invention can be applied to semiconductor devices such as MMICs (monolithic microwave integrated circuits) and modules that use HEMTs or MESFETs (metal semiconductor field effect transistors), and the same effects are obtained.

Since the semiconductor device according to the present invention have the foregoing construction, the following advantages are yielded.

According to one aspect of the invention, there is provided a semiconductor device comprising: a substrate having a main surface, an MIM capacitor having a first electrode layer disposed on the main surface of the substrate, second and third electrode layers facing the first electrode layer through a dielectric layer; a terminal pad connected to the first electrode layer of the MIM capacitor; a first terminal connected to the second electrode layer of the MIM capacitor; a second terminal connected to the third electrode layer of the MIM capacitor; and a first active element whose first electrode is connected to the second electrode layer of the MIM capacitor.

Accordingly, the withstand voltage test of MIM capacitors can be conducted without damaging the first active element, defective products can be eliminated in the early stages of the process, and the yield of the final products can be improved. In its turn, semiconductor devices of a high reliability can be provided at low costs.

According to another aspect of the present invention, there is provided the semiconductor device, wherein the dielectric layer is disposed on the first electrode layer, and the second and third electrode layers are disposed in parallel to each other on the surface of the dielectric layer.

Accordingly, the connection between the second and third electrode layers and terminals or active elements is simplified. Therefore, the constitution of semiconductor devices is simplified, and in turn, semiconductor devices can be provided at low costs.

In still another aspect of the present invention, there is provided the semiconductor device, wherein the first electrode layer is divided into two portions, the second and third electrode layers are separately disposed on each of the divided portions of the first electrode layer, and each of the divided portions of the first electrode layer is connected to said terminal pad.

Accordingly, the constitution becomes simplified, and mutual interference of the two capacitors constituting the MIM capacitors is small. Therefore, an MIM capacitor having an adequate capacity can be constituted easily. In its turn, semiconductor devices having good electrical properties can be provided.

In yet another aspect of the present invention, there is provided the semiconductor device, wherein the first electrode layer is integrally disposed.

Accordingly, the area for installing the MIM capacitor can be reduced. Therefore the RF properties of semiconductor devices can be improved. In its turn, small semiconductor devices having good RF properties can be constituted.

In yet another aspect of the present invention, there is provided the semiconductor device, wherein the second and third electrode layers are comb-shaped, and are disposed on said dielectric layer facing each other.

Accordingly, the size of the MIM capacitor can be reduced, and the capacity thereof can be increased. Therefore, the RF properties of semiconductor devices can be improved. In its turn, small semiconductor devices having good RF properties can be constituted.

In yet another aspect of the present invention, there is provided the semiconductor device, wherein the dielectric layer has a through-hole that exposes a part of the first electrode layer, said terminal pad is disposed on the first electrode layer through the through-hole, and the second and third electrode layers are disposed on so that the terminal pad intervene between them.

Accordingly, no wiring layer for connecting to the terminal pad is required, and the substrate area of the semiconductor device can be reduced. In its turn, small semiconductor devices can be constituted.

In yet another aspect of the present invention, there is provided the semiconductor device, wherein the second and third electrode layers are disposed overlapping each other through the first electrode layer.

Accordingly, the area for installing the MIM capacitor can be reduced, and the material and thickness of the dielectric layer between the first electrode layer and the second and third electrode layers can be selected easily. Consequently, the capacities can be selected easily, and the freedom of the design of MIM capacitors can be elevated. Therefore, the size of the paired MIM capacitors can be reduced, the capacity thereof can be optimized, and the RF properties of semiconductor devices can be improved. In its turn, small semiconductor devices having good RF properties can be constituted.

In yet another aspect of the present invention, there is provided the semiconductor device, wherein said terminal pad is connected to the first electrode layer through an impedance adjusting element, inclusive of making said terminal pad itself into the impedance adjusting element.

Accordingly, the effect of the terminal pad on the RF properties of semiconductor devices can be reduced. In its turn, semiconductor devices having good RF properties can be constituted by a simple constitution.

In yet another aspect of the present invention, there is provided the semiconductor device, further comprising a second active element whose first electrode is connected to the third electrode layer.

Accordingly, the withstand voltage test of the separating capacitor between the amplifier stages of a multistage constitution can be conducted without damaging the first and second active elements. Therefore, the defective products of the separating capacitors between the amplifier stages of a multistage constitution can be eliminated in the early stage of the process, and the yield of the final products can be improved. In its turn, semiconductor devices having a high reliability including amplifiers of a multistage constitution can be provided at low costs.

While the presently preferred embodiments of the present invention have been shown and described, it is to be understood these disclosures are for the purpose of illustration and that various changes and modifications may be made without departing from the scope of the invention as set forth in the appended claims.

What is claimed is:

1. A semiconductor device comprising:

a substrate having a main surface;

a metal-insulator-metal (MIM) capacitor having a first electrode layer disposed on the main surface of said substrate, second and third electrode layers facing the first electrode layer and a dielectric layer between the first electrode layer and the second and third electrode layers;

a terminal pad connected to the first electrode layer of the MIM capacitor;

a first terminal connected to the second electrode layer of the MIM capacitor;

a second terminal connected to the third electrode layer of the MIM capacitor; and a first active element having a first electrode connected to the second electrode layer of the MIM capacitor.

2. The semiconductor device according to claim 1, wherein the dielectric layer is disposed on the first electrode layer, and the second and third electrode layers are parallel to each other on a surface of the dielectric layer.

3. The semiconductor device according to claim 2, wherein the first electrode layer is divided into two portions, the second and third electrode layers are respectively disposed on a corresponding one of the two portions of the first electrode layer, and each of the two portions of the first electrode layer is connected to said terminal pad.

4. The semiconductor device according to claim 2, wherein the first electrode layer is integrally disposed.

5. The semiconductor device according to claim 4, wherein the second and third electrode layers are comb-shaped, and are disposed on said dielectric layer facing each other.

6. The semiconductor device according to claim 4, wherein the dielectric layer has a through-hole that exposes a part of the first electrode layer, the terminal pad is disposed on the first electrode layer in the through-hole, and the terminal pad is between the second and third electrode layers.

7. The semiconductor device according to claim 1, wherein the second and third electrode layers overlap each other with respect to the first electrode layer.

8. The semiconductor device according to claim 1, including an impedance adjusting element and wherein the terminal pad is connected to the first electrode layer through the impedance adjusting element.

9. The semiconductor device according to claim 1, further comprising a second active element having a first electrode connected to the third electrode layer.

10. The semiconductor device according to claim 1 wherein the terminal pad is an impedance adjusting element.

* * * * *